United States Patent
Kondo

(10) Patent No.: US 7,151,313 B2
(45) Date of Patent: Dec. 19, 2006

(54) METHOD OF FORMING WIRINGS FOR TILE-SHAPED ELEMENTS, STRUCTURES OF WIRINGS FOR TILE-SHAPED ELEMENTS, AND ELECTRONIC EQUIPMENT

(75) Inventor: Takayuki Kondo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 25 days.

(21) Appl. No.: 10/934,600

(22) Filed: Sep. 7, 2004

(65) Prior Publication Data

US 2005/0098775 A1    May 12, 2005

(30) Foreign Application Priority Data

Sep. 11, 2003 (JP) ............................. 2003-319985
Jun. 14, 2004 (JP) ............................. 2004-176063

(51) Int. Cl.
*H01L 23/48* (2006.01)
(52) U.S. Cl. ................ 257/741; 257/40; 257/746; 257/E23.078
(58) Field of Classification Search ............... 257/741
See application file for complete search history.

(56) References Cited

U.S. PATENT DOCUMENTS

| 4,585,548 A * | 4/1986 | Cadzow et al. ............... 75/428 |
| 2001/0036718 A1 * | 11/2001 | Williams ..................... 438/597 |
| 2002/0028527 A1 * | 3/2002 | Maeda et al. ................. 438/29 |
| 2005/0145839 A1 * | 7/2005 | Yamamoto et al. ........... 257/40 |

FOREIGN PATENT DOCUMENTS

| JP | 2000-058562 | 2/2000 |
| JP | A 2003-197881 | 7/2003 |
| JP | A 2003-204047 | 7/2003 |
| JP | A 2003-347672 | 12/2003 |
| JP | A 2004-014913 | 1/2004 |
| JP | A 2004-021034 | 1/2004 |
| JP | A 2004-022901 | 1/2004 |
| JP | A 2004-023058 | 1/2004 |
| JP | A 2004-126152 | 4/2004 |
| JP | A 2004-172965 | 6/2004 |
| JP | A 2004-191390 | 7/2004 |
| JP | A 2004-191391 | 7/2004 |
| JP | A 2004-191392 | 7/2004 |
| WO | PCT/JP03/01290 | * 8/2006 |

* cited by examiner

*Primary Examiner*—Tu-Tu Ho
(74) *Attorney, Agent, or Firm*—Oliff & Berridge, PLC

(57) ABSTRACT

Methods are provided to form wirings for tile-shaped elements, structures of wirings for tile-shaped elements, and electronic equipment, with which highly reliable electrical wirings having minute wiring patterns can be formed. In wiring forming method for a tile-shaped element, which is used, when a circuit device is formed by connecting a tile-shaped element having at least an electrode and a tile configuration to a final substrate having at least an electrode, to form an electrical wiring that electrically connects the electrode of the tile-shaped element to the electrode of the final substrate, liquid material including electro conductive material is applied to at least a part of a wiring region that is a region where the electrical wiring is formed on at least one of surfaces of the final substrate and the tile-shaped element.

14 Claims, 10 Drawing Sheets

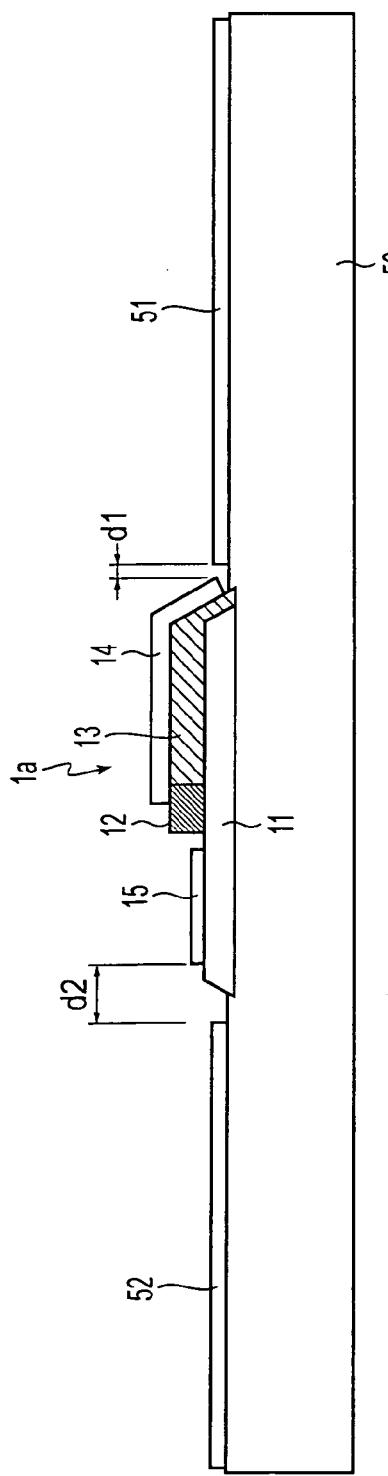
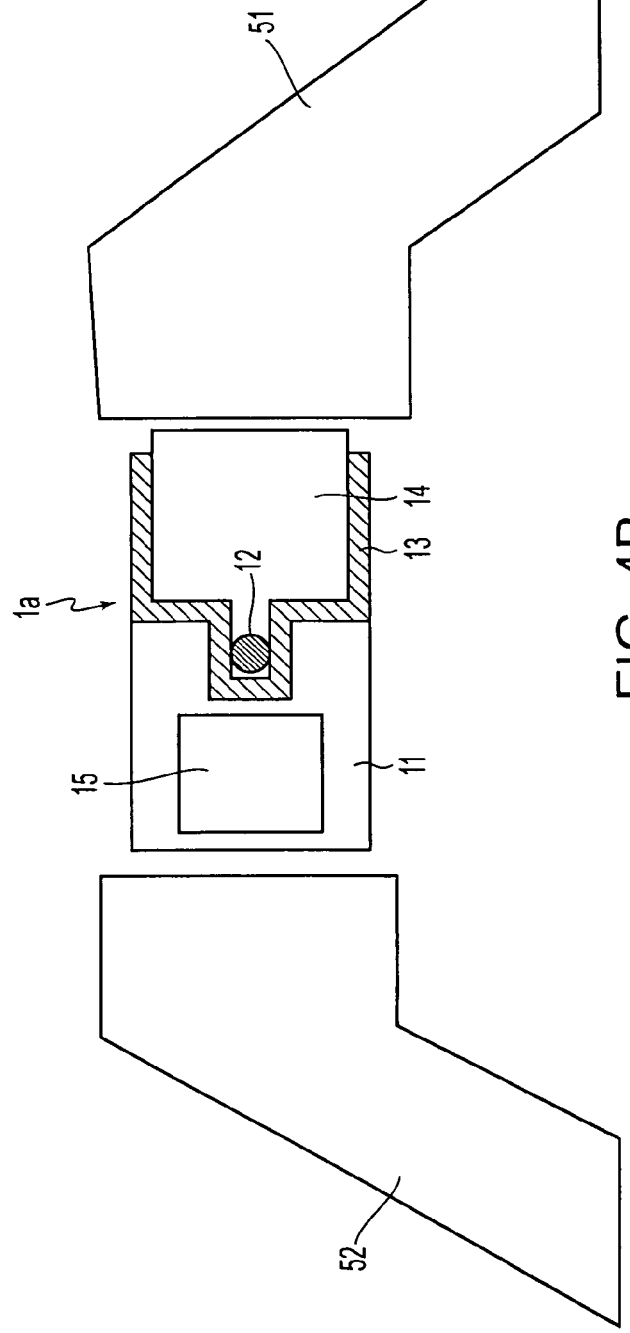

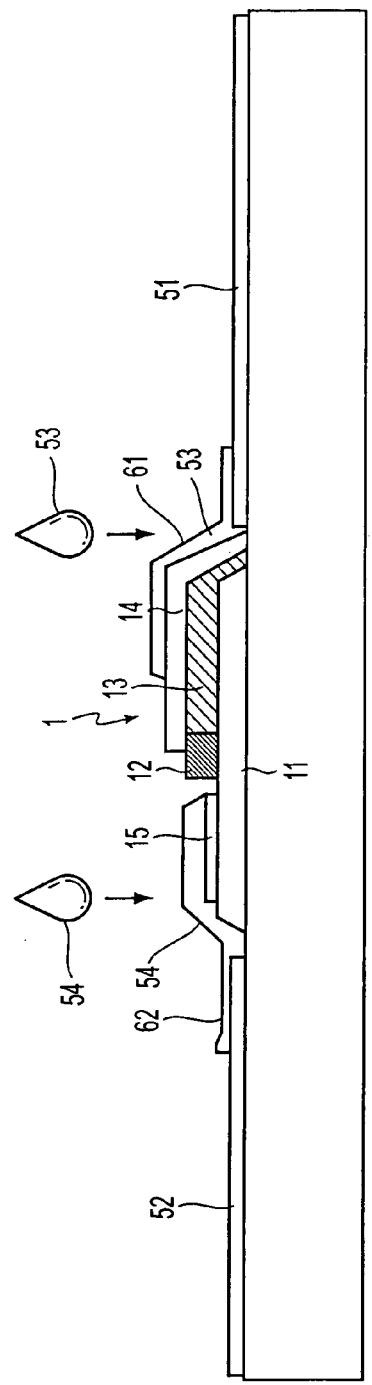
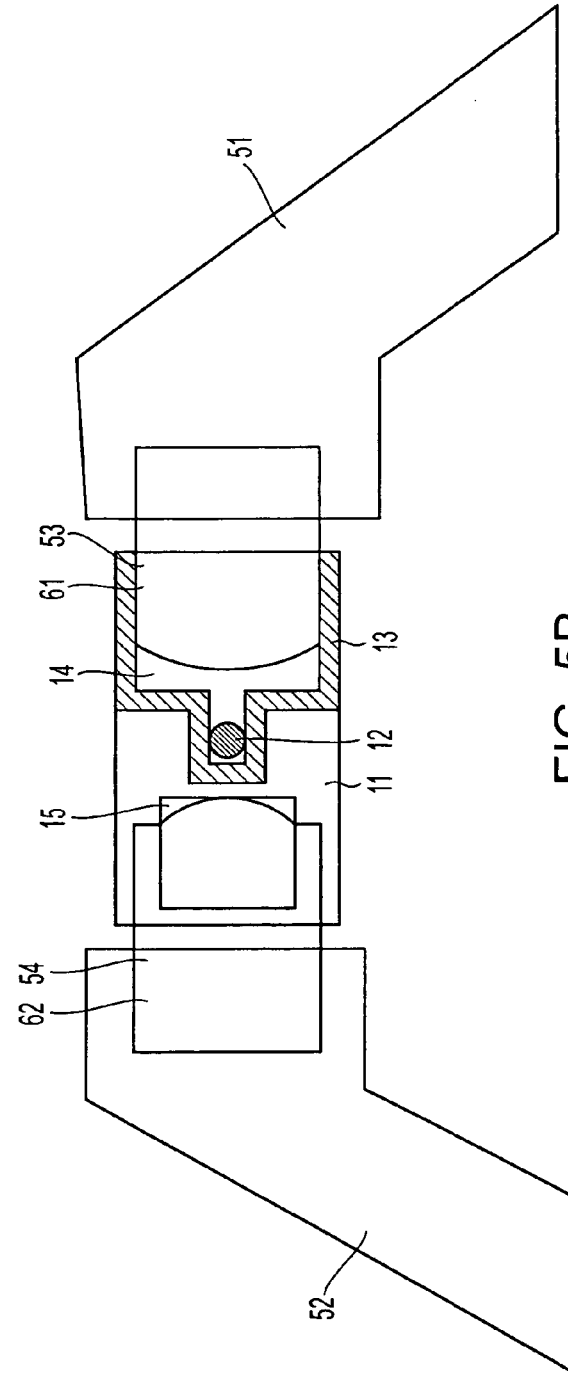
FIG. 5A
FIG. 5B

METHOD OF FORMING WIRINGS FOR TILE-SHAPED ELEMENTS, STRUCTURES OF WIRINGS FOR TILE-SHAPED ELEMENTS, AND ELECTRONIC EQUIPMENT

BACKGROUND OF THE INVENTION

1. Field of Invention

Exemplary aspects of the invention relate to methods of forming wirings for tile-shaped elements, structures of wirings for tile-shaped elements, and electronic equipment.

2. Description of Related Art

The related art includes epitaxial lift-off (ELO) methods, in which semiconductor elements formed on a substrate are diced into micro tile elements (semiconductor elements), each in the shape of a micro tile configuration, and separated from the substrate. The micro tile element is handled and attached to an optional substrate (final substrate), thereby forming a substrate equipped with a thin film device (circuit device). See Japanese Laid-open Patent Application 2000-58562.

SUMMARY OF THE INVENTION

In the related art, an electrode (terminal) of the micro tile element is connected with an electrical wiring to an electrode (terminal) of a circuit that is provided on the final substrate. However, for example, when an electrode provided on an upper surface of the micro tile element that is to be wired has a polarity different from that of the upper surface or a side surface of the micro tile element, the electrical wiring must be formed to cross over the upper surface or the side surface of the micro tile element.

However, when the electrical wiring is formed by aerial wiring, such as wire bonding, the wiring work requires substantial time. In particular, minute wiring work is difficult and results in a substantially large manufacturing cost. When the electrical wiring is formed by using a method, such as vapor deposition of metal thin films or photolithography, a substantially large manufacturing cost is required because masks having desired patterns must be formed. Furthermore, coping with design changes, such as changes in the wiring positions is expensive.

Exemplary aspects of the invention address the above and/or other circumstances, and provide methods of forming wirings for tile-shaped elements, structures of wirings for tile-shaped elements, and electronic equipment, with which highly reliable electrical wirings having micro wiring patterns can be formed.

Exemplary aspects of the invention provide methods of forming wirings for tile-shaped elements, structures of wirings for tile-shaped elements, and electronic equipment, which, when composing a thin film device (a circuit device) by attaching a micro tile-shaped element onto a substrate, can achieve further miniaturization, lower the manufacturing cost, and reduce short-circuit or breakage of wirings for the thin film device.

To address or achieve the aforementioned and/or other advantages, a wiring forming method for a tile-shaped element in accordance with an exemplary aspect of the invention pertains to a wiring forming method for a tile-shaped element, which is used, when a circuit device is formed by connecting a tile-shaped element having at least an electrode and a tile configuration to a substrate having at least an electrode and to form electrical wiring that electrically connects the electrode of the tile-shaped element to the electrode of the substrate. Liquid material including conductive material is coated on at least a part of a wiring region that is a region where the electrical wiring is formed on at least one of surfaces of the substrate and the tile-shaped element. According to an exemplary aspect of the invention, by forming an electroconductive film by setting the liquid material coated on the wiring region, an electrical wiring can be formed in the wiring region. An electrical wiring to connect an electrode of a tile-shaped element and an electrode of a substrate (final substrate) can be formed without using a method, such as aerial wiring, vapor deposition of metal thin films, photolithography or the like. Accordingly, waste of constituting material of electrical wirings can be reduced, and highly reliable electrical wirings can be formed even on a surface with irregularities. Therefore, in accordance with an exemplary aspects of the invention, a highly reliable electrical wiring with a minute wiring pattern to connect an electrode of a tile-shaped element and an electrode of a substrate can be provided at low cost.

In the wiring forming method for a tile-shaped element in accordance with an exemplary aspect of the invention, the tile-shaped element may be formed into the tile configuration by cutting and separating from the first substrate an electronic functional section formed on a first substrate that is different from the substrate. In accordance with an exemplary aspect of the invention, a semiconductor device can be provided on any desired substrate (final substrate) by using an epitaxial lift-off method. For example, a sacrificial layer is formed on a first substrate that is different from the substrate (final substrate). A semiconductor element, that defines the tile-shaped element, is formed on the sacrificial layer. The sacrificial layer is etched, to thereby cut and separate the semiconductor element from the substrate to provide the tile-shaped element. A semiconductor element cut and separated in a tile configuration (tile-shaped element) can be bonded to an optional substrate so that a semiconductor device can be formed at any desired location in the substrate. It is noted here that the semiconductor element may be composed of a compound semiconductor or a silicon semiconductor. A substrate that is bonded to the semiconductor element may be a silicon semiconductor substrate or a compound semiconductor substrate or may be composed of other material. Therefore, in accordance with an exemplary aspect of the invention, a semiconductor element can be formed on a substrate that is composed of material different from that of the semiconductor element. For example, a semiconductor device, such as a surface-emitting laser or a photodiode formed from gallium arsenide may be formed on a silicon semiconductor substrate. Furthermore, after semiconductor elements are completed on a semiconductor substrate, they are separated into micro tile configurations. Accordingly, the semiconductor elements can be tested and selected in advance prior to manufacture of integrated circuits. It is noted here that the tile-shaped elements may not be semiconductor elements, so long as they have electrodes.

In the wiring forming method for a tile-shaped element in accordance with the invention, the wiring region may be a continuous region including at least a part of the electrode of the tile-shaped element and at least a part of the electrode of the substrate. Also, in the wiring forming method for a tile-shaped element in accordance with an exemplary aspect of the invention, a conductive film may be formed by conducting a process to set the liquid material coated on the wiring region. The conductive film may define at least a part of the electrical wiring. In accordance with an exemplary aspect of the invention, liquid material including electroconductive material can be filled in a single continuous region (wiring region) including the electrode of the tile-shaped element and the electrode of the substrate, to thereby form an electrical wiring that electrically connects the electrode of the tile-shaped element and the electrode of the substrate.

Furthermore, in the wiring forming method for a tile-shaped element in accordance with an exemplary aspect of the invention, the liquid material may be formed from a liquid in which electroconductive fine particles are dispersed in a solvent. The solvent may have volatility. In accordance with an exemplary aspect of the invention, the liquid material is applied automatically and quickly dries up, such that the liquid material coated on the wiring region can be quickly and excellently formed into a conductive film. The solvent may include any one of water, alcohol, acetone, xylene, toluene, tetradecane, N-methylpyrrolidone and fluorocarbon.

In the wiring forming method for a tile-shaped element in accordance with the invention, the solvent may include binder material. In accordance with an exemplary aspect of the invention, by including binder material that functions as binding material in the solvent, an electrical wiring having a desired configuration including a desired thickness can be formed. The binder material may be one in which resin is dissolved in a solvent. The binder material may be composed of epoxy, acrylic resin or polyimide. When a conductive film is formed by volatilizing the solvent including the binder material, the binder material may remain in the conductive film. Also, the binder material may be one that enhances the strength of the electroconductive film, and the one that enhances adhesion between the electroconductive film and the surface of the wiring region. In accordance with an exemplary aspect of the invention, an electrical wiring composed of an electroconductive film that has a minute electroconductive film pattern in a desired configuration, high mechanical strength, and high adhesion with the surface of the wiring region can be formed. Accordingly, highly reliable electrical wirings in a minute configuration with a low event probability of short-circuit and breakage can be formed.

Further, in the wiring forming method for a tile-shaped element in accordance with an exemplary aspect of the invention, the binder material may be formed from electroconductive organic polymer. The electroconductive organic polymer may be one of poly(p-phenylene), polypyrrole, polythiazyl, polyacetylene, poly(p-phenylene-vinylene), polythiophene and polyaniline. According to an exemplary aspect of the invention, excellent electrical wirings with high electrical conductivity can be formed by using liquid material. A very fine electrical wiring that has a low resistance value with a low incidence rate of line-breakage and short-circuit can be readily provided. In the wiring forming method for a tile-shaped element in accordance with an exemplary aspect of the invention, the electroconductive fine particles may be composed of metal. The metal may be one of silver, gold, copper, nickel, palladium, tin, and solder. Alternatively, the electroconductive fine particles may be composed of carbon. The carbon may be one of carbon powder, fullerene and carbon nanotubes. In accordance with an exemplary aspect of the invention, an excellent electrical wiring having high electrical conductivity, high mechanical strength, and flexibility can be provided by using liquid material.

In the wiring forming method for a tile-shaped element in accordance with an exemplary aspect of the invention, the process to set the liquid material may be composed of a drying process and a heating process. In accordance with an exemplary aspect of the invention, liquid material coated on the wiring region can be formed into an electroconductive film and an electrical wiring by drying process and heating process. Coating the liquid material on the wiring region and the drying process may be conducted generally at the same time. For example, by applying the liquid material in a state in which the temperature of the substrate is elevated, coating the liquid material on the wiring region and the drying process may be conducted at the same time. According to an exemplary aspect of the invention, an excellent electrical wiring can be formed quickly by using liquid material. It is noted here that only the wiring region may be selectively heated, instead of heating the entire substrate. In the wiring forming method for a tile-shaped element in accordance with an exemplary aspect of the invention, the drying process and the heating process may be conducted generally at the same time. In the wiring forming method for a tile-shaped element in accordance with an exemplary aspect of the invention, the application of the liquid material to the wiring region, the drying process and the heating process may be conducted generally at the same time.

Furthermore, in the wiring forming method for a tile-shaped element in accordance with an exemplary aspect of the invention, the liquid material may be coated on the wiring region by dripping the liquid material in the wiring region by using an ink jet nozzle or a dispenser. According to an exemplary aspect of the invention, masks that are necessary in the case of a photolithography method are not required to be formed, and waste of material due to etching or the like can be reduced or eliminated. Consequently, the amount of constituting material of electrical wirings can be reduced, changes in the design can be readily coped with, and the manufacturing cost can be reduced.

In the wiring forming method for a tile-shaped element in accordance with an exemplary aspect of the invention, the liquid material may be applied to the wiring region by a screen printing method or a pad printing method. It is noted here that the screen printing method is a printing method in which a screen having a pattern formed with presence or absence of opening sections is placed on a base material (substrate) to be printed and paste (liquid material) is adhered only to openings by using the opening sections. Even in the screen printing method, a non-contact coating by using a dispenser is possible. The screen printing method can reduce waste of liquid material, compared to the case where a spin coat method is used. The pad printing method is a technique in which grooves are cut in reverse images of wiring regions in, for example, a metal plate. Liquid material is printed in the grooves. A pad made of silicon rubber or the like is pressed against the plate, and the liquid material is transferred onto the pad. The pad is pressed against a specified area on a substrate (member to be printed) to thereby complete the transfer, so that the liquid material is coated on a wiring region. By using the pad printing method, electrical wirings can be excellently formed in wiring regions with irregularities, for example, when the electrical wirings are formed after a tile-shaped element is bonded to a substrate.

The wiring forming method for a tile-shaped element in accordance with an exemplary aspect of the invention may be conducted after the tile-shaped element is bonded to the substrate. According to an exemplary aspect of the invention, the liquid material may be continuously coated to cover the electrode of the tile-shaped element and the electrode of the substrate, to thereby form electrical wirings. Accordingly, even when the position of the tile-shaped element slightly deviates when the tile-shaped element is bonded to the substrate, the electrode of the tile-shaped element and the electrode of the substrate can be electrically connected in a highly reliable manner by, for example, adjusting the coating position.

A wiring structure for a tile-shaped element in accordance with an exemplary aspect of the invention pertains to a wiring structure for a tile-shaped element defining a component of a structure in which a tile-shaped element having at least an electrode and a tile configuration is bonded to a substrate having at least an electrode, and having an electrical wiring that electrically connects the electrode of the tile-shaped element to an electrode of the substrate. The electrical wiring is formed from a binder material, and the binder material is composed of one of epoxy, acrylic resin and polyimide. According to an exemplary aspect of the invention, the mechanical strength of the electroconductive film composing the electrical wiring can be enhanced and adhesion between the electroconductive film and the surface of the wiring region (substrate or tile-shaped element) can be increased. Accordingly, highly reliable electrical wirings in a minute configuration with a low probability of short-circuit and breakage can be formed at low costs.

In the wiring structure for a tile-shaped element in accordance with an exemplary aspect of the invention, the binder material may be formed from electroconductive organic polymer. One of poly(p-phenylene), polypyrrole, polythiazyl, polyacetylene, poly(p-phenylene-vinylene), polythiophene and polyaniline may be used as the electroconductive organic polymer. According to an exemplary aspect of the invention, excellent electrical wirings with a high electrical conductivity can be formed by using liquid material. A very fine electrical wiring that has a low resistance value with a low incidence rate of line-breakage and short-circuit can be readily provided.

In the wiring structure for a tile-shaped element in accordance with an exemplary aspect of the invention, the electrical wiring may be formed from electroconductive fine particles composed of metal or carbon. As the metal, silver, gold, copper, nickel, palladium, tin, or solder can be used. As the carbon, carbon powder, fullerene or carbon nanotubes can be used. In accordance with an exemplary aspect of the invention, an excellent wiring structure for a tile-shaped element having a higher electrical conductivity, higher mechanical strength, and flexibility can be provided by using liquid material. In the wiring structure for a tile-shaped element in accordance with an exemplary aspect of the invention, the surface of the electrode of the tile-shaped element and the surface of the electrode of the substrate may be composed of one of gold, alloy including gold, platinum, silver, copper and nickel. According to the exemplary aspect of the invention, the contact resistance caused between the electrical wiring formed from the liquid material and the electrode of the tile-shaped element or the electrode of the substrate can be reduced. The wiring structure for a tile-shaped element in accordance with an exemplary aspect of the invention may be manufactured by using the wiring forming method for a tile-shaped element described above. According to an exemplary embodiment of the invention, a highly reliable wiring structure in a minute configuration with a low probability of short-circuit and line-breakage can be formed at low costs.

An electronic equipment in accordance with an exemplary aspect of the invention includes the wiring structure for a tile-shaped element described above. According to an exemplary aspect of the invention, electrical equipment equipped with a tile-shaped element that is formed by using an epitaxial lift-off (ELO) method can be made in a more compact size than the related art, and can be provided as an equipment with a low probability of short-circuit failure and line-breakage failure at low costs.

BRIEF DESCRIPTION OF THE DRAWINGS

FIGS. 4A–B are schematics illustrating a state in which the micro tile-shaped element described above is bonded to a final substrate;

FIGS. 5A–B are schematics illustrating the wiring forming method in accordance with the second exemplary embodiment of the invention and a circuit device manufactured by the wiring forming method;

DETAILED DESCRIPTION OF EXEMPLARY EMBODIMENTS

First Exemplary Embodiment

A wiring forming method for a tile-shaped element and a wiring structure for a tile-shaped element in accordance with a first exemplary embodiment of the invention are described below. As an example of a tile-shaped element in accordance with the present exemplary embodiment, a micro tile-shaped element in a minute tile configuration is described. However, the invention is not limited to this, and can be applied to a tile-shaped element that is not minute. First, a wiring forming method for a tile-shaped element and a wiring structure for a tile-shaped element in accordance with the first exemplary embodiment of the invention are described with reference to FIGS. 1A–B and FIGS. 2A–B.

Figure 1A:
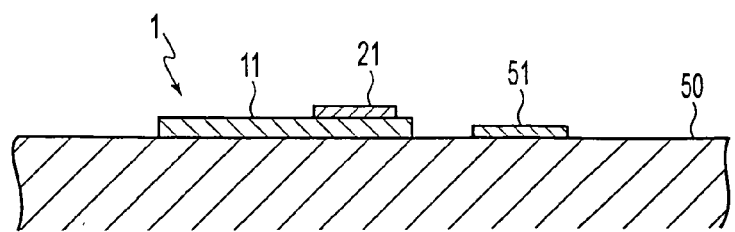
FIGS. 1A–B are schematics illustrating a micro tile-shaped element applied to a wiring forming method in accordance with a first exemplary embodiment of the invention.
Figure 1B:
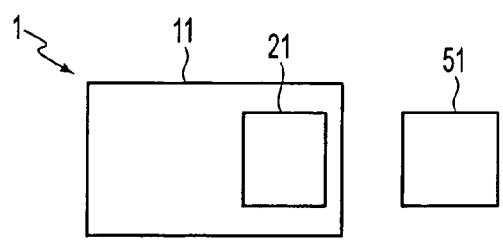

FIGS. 1A–B are schematics in which a micro tile-shaped element is bonded to a final substrate. A micro tile-shaped element 1 is equipped with a tile section 11 in a tile configuration and an electrode 21 provided on an upper surface of the tile section 11. The tile section 11 may have a functional element, such as a transistor or a semiconductor laser. However, the tile section 11 is not limited to a semiconductor element. The micro tile-shaped element 1 is formed into a tile configuration by dicing electronic functional sections formed on a substrate (first substrate) that is different from a final substrate 50, and separating the same from the first substrate. The final substrate 50 is not particularly limited and may be any suitable material so long as it is formed from material different from that of the first substrate. Also, an electrode 51 is provided on a surface of the final substrate 50. An integrated circuit or the like connected via wiring to the electrode 51 may be provided on the final substrate 50. The micro tile-shaped element 1 is adhered to the surface of the final substrate 50 with adhesive or the like.

Figure 2A:
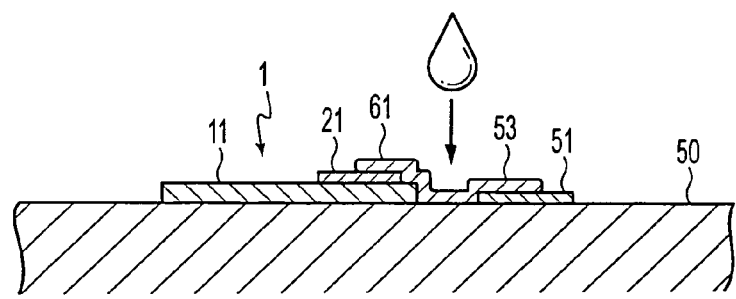
FIGS. 2A–B are schematics illustrating the wiring forming method in accordance with the first exemplary embodiment of the invention and a circuit device manufactured by the wiring forming method.
Figure 2B:
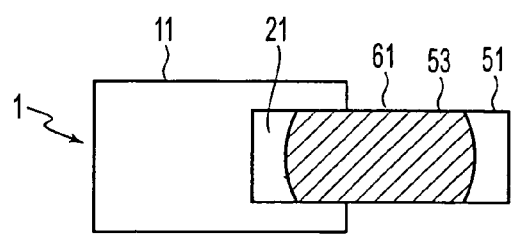

Next, as shown in FIGS. 2A–B, an electrical wiring that connects the electrode 51 of the final substrate 50 and the electrode 21 of the micro tile-shaped element 1 is formed. FIGS. 2A–B show a wiring forming method in accordance with a first exemplary embodiment of the invention, and a circuit device (thin film device) manufactured by the wiring forming method. Specifically, liquid material 53 including electroconductive material is applied to a wiring region 61 that is a region with hatching in FIG. 2(B). The application of the liquid material 53 may be conducted by dripping droplets of the liquid material 53 in the wiring region 61. The liquid material 53 may be applied by other methods. The method to apply the liquid material 53 to the wiring region 61 is described in detail below.

Here, the wiring region 61 is an area where an electrical wiring that electrically connects the electrode 21 of the micro tile-shaped element 1 and the electrode 51 of the final substrate 50 is formed, and a continuous area that includes at least a part of the electrode 21 of the micro tile-shaped element 1 and at least a part of the electrode 51 of the final substrate 50. Then, by conducting a drying process and a heating process on the liquid material 53, the liquid material 53 is set to form an electroconductive film. The electroconductive film formed in the wiring region 61 becomes an electrical wiring that connects the electrode 51 and the electrode 21. By the steps described above, the final substrate 50 is mechanically and electrically connected to the micro tile-shaped element 1, whereby one circuit device (thin film device) is completed.

Consequently, in accordance with the present exemplary embodiment, the electrical wiring that connects the electrode 21 of the micro tile-shaped element 1 and the electrode 51 of the final substrate 50 can be formed without using techniques, such as aerial wiring, metal thin film vapor deposition or photolithography. Therefore, wastes of material composing the electrical wiring that may be caused by etching or the like can be reduced, and the manufacturing cost can be reduced. Moreover, the electrical wiring is formed by applying the liquid material 53, a highly reliable electrical wiring can be formed even on a surface with irregularities. Therefore, in accordance with the exemplary embodiment of the invention, a highly reliable electrical wiring with a minute wiring pattern to connect the electrode 21 of the tile-shaped element 1 and the electrode 51 of the final substrate 50 can be provided at low costs.

Example of Liquid Material

Next, examples of the liquid material 53 described above are described. The liquid material 53 can be a liquid body in which electroconductive fine particles are dispersed in a solvent. For example, after applying the liquid material 53 on the wiring region 61, the solvent may be evaporated, and the electroconductive fine particles may be sintered, whereby an electrical wiring composed of an electroconductive film can be formed. The solvent may possess volatility. Thus, it is possible to make the solvent volatilize only by leaving it without conducting a special drying process to the applied liquid material 53 for a predetermined period of time. Moreover, the drying time can be shortened. As examples of the solvent, water, alcohol, acetone, xylene, toluene, tetradecane, N-methylpyrrolidone and fluorocarbon can be enumerated.

The solvent that composes the liquid material 53 may include binder material. For example, a binder material in which resin is dissolved in a solvent can be used. The binder material may be one that remains in the electroconductive film when the solvent including the binder material is volatilized and the electroconductive film is formed. By so doing, when the electroconductive film is formed by conducting a drying process and a heating process on the liquid material 53, mechanical strength of the electroconductive film can be enhanced, and adhesion between the electroconductive film (electrical wiring) and the surface of the wiring region (substrate) can be enhanced. In addition, the thickness of the electroconductive film can be controlled. The binder material may function as a protection film for the electroconductive film that is formed by heat-treating electroconductive fine particles. As concrete examples of the binder material, epoxy, acrylic resin, polyimide, etc. can be enumerated.

Electroconductive organic polymer may be used as the binder material. By so doing, gaps among the electroconductive fine particles can be filled with the electroconductive organic polymer, such that an excellent electrical wiring having a high conductivity can be formed by using the liquid material 53. A very fine electrical wiring that has a low resistance value with a low incidence rate of line-breakage and short-circuit can be readily formed. As examples of the electroconductive organic polymer, poly(p-phenylene), polypyrrole, polythiazyl, polyacetylene, poly(p-phenylenevinylene), polythiophene and polyaniline may be enumerated.

As the electroconductive fine particles to be dispersed in a solvent, metal, such as, for example, silver, gold, copper, nickel, palladium, tin, and solder may be used. As the electroconductive fine particles, for example, carbon, such as, carbon powder, fullerene and carbon nanotubes can be used. By so doing, an excellent wiring having a higher electrical conductivity, higher mechanical strength, and flexibility can be provided by using the liquid material 53.

Therefore, even if the wiring region is irregular, an excellent electric wiring can be formed by applying the liquid material 53 on the wiring region. Accordingly, in accordance with the present exemplary embodiment, a highly reliable electric wiring that connects the electrode 21 of the micro tile-shaped element 1 and the electrode 51 of the final substrate 50, in a minute configuration, with a low probability of short-circuit and line-breakage, can be formed.

Examples of Application Method

Next, examples of the method of applying the liquid material 53 to the wiring region 61 are described. For example, a method in which the liquid material 53 is once applied to the entire surface of the final substrate 50 including the surface of the minute tile element 1, and then, the liquid material 53 applied on areas other than the wiring region 61 is removed, to thereby coat the liquid material only on the wiring region 61, can be used. However, according to this method, the amount of the liquid material 53 that becomes wasted is large. Thus, it is desirable to use a method in which the liquid material 53 is initially, selectively applied only to the wiring region 61.

A droplet discharge method to jet the liquid material 53 as droplets from an ink jet nozzle, that may be used with, for example, an ink-jet printer, or the like, can be used as the method to selectively apply the liquid material 53. Moreover, the liquid material 53 may be discharged as droplets by using a dispenser. According to these methods, because the liquid material 53 can be dripped only onto the wiring region 61 from the beginning, almost no liquid material 53 becomes wasted. Moreover, because a mask corresponding to the wiring region 61 does not need to be made, changes in the design can be readily coped with, and the manufacturing cost can be reduced.

A screen printing method may be used to selectively apply the liquid material 53. The screen printing method is a printing method in which a screen having a pattern formed with the presence or absence of an opening section is placed on a base material (the final substrate 53 and the micro tile-shaped element 1) to be printed, and the liquid material 53 is adhered only to an open area by using the opening section. The opening section is disposed at a position corresponding to the wiring region 61. The screen printing method can reduce waste of the liquid material 53, compared to the case where a spin coat method is used in which the liquid material 53 is applied to the entire surface of the substrate material. In this screen printing method, a non-contact application using a dispenser is possible. Specifically, by applying droplets of the liquid material 53 through the screen, the liquid material 53 can be coated on the desired wiring region 61 more accurately and finely, such that an accurate, fine and highly reliable electrical wiring can be provided.

A pad printing method may be used to selectively apply the liquid material 53. The pad printing method is a technique by which excellent printing can be performed even when a surface to be printed is not flat, but instead is irregular. Specifically, according to the pad printing method, grooves are cut in a reversed image of the wiring region 61 in, for example, a metal plate. The liquid material 53 is printed in the grooves. A pad made of silicon rubber or the like is pressed against the plate, and the liquid material 53 is transferred onto the pad. Then, the pad is pressed against a specified area on the final substrate 50 (the wiring region 61) that is bonded to the micro tile-shaped element 1, to complete the transfer. As a result, the liquid material 53 is coated on the wiring region 61. By using the pad printing method described above, an electrical wiring can be formed on a wiring region with irregularities, for example, when the electrical wiring is formed after the tile-shaped element 1 is bonded to the final substrate 50.

Process to Set Liquid Material

To set the liquid material 53 applied on the wiring region 61 to form an electroconductive film defining an electrical wiring, a drying process and then a heating process are conducted. Here, the application of the liquid material 53 to the wiring region 61 and the drying process may be conducted generally at the same time. For example, the liquid material 53 may be applied in a state in which the temperature of the micro tile-shaped element 1 and the final substrate 50 is elevated. By so doing, the electrical wiring can be formed quickly by using the liquid material 53. It is noted here that only the wiring region 61 may be selectively heated, instead of elevating the temperature of the final substrate 50 and the micro tile-shaped element 1 entirely. For example, a laser beam may be irradiated to selectively heat. By so doing, thermal damages to the functional devices provided on the final substrate 50 and the micro tile-shaped element 1 can be avoided. The drying process and the heating process may be conducted generally at the same time. Also, the application of the liquid material 53 to the wiring region 61, the drying process and the heating process may be conducted generally at the same time. Consequently, the electrical wiring can be formed more quickly and excellently.

Second Exemplary Embodiment

Figure 3A:
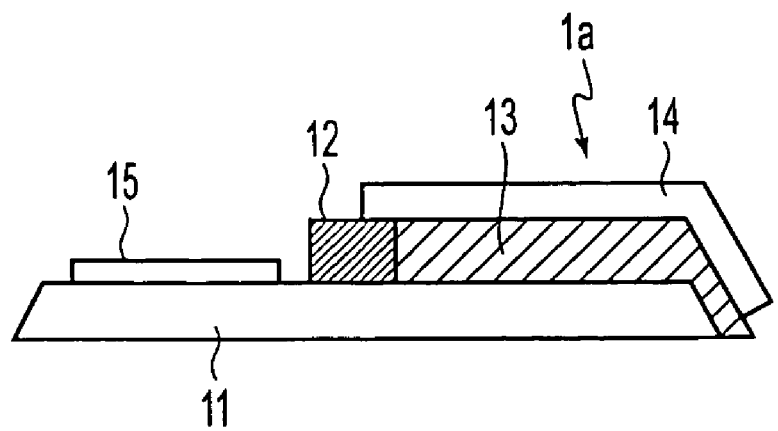
FIGS. 3A–B are schematics illustrating a micro tile-shaped element applied to a wiring forming method in accordance with a second exemplary embodiment of the invention.
Figure 3B:
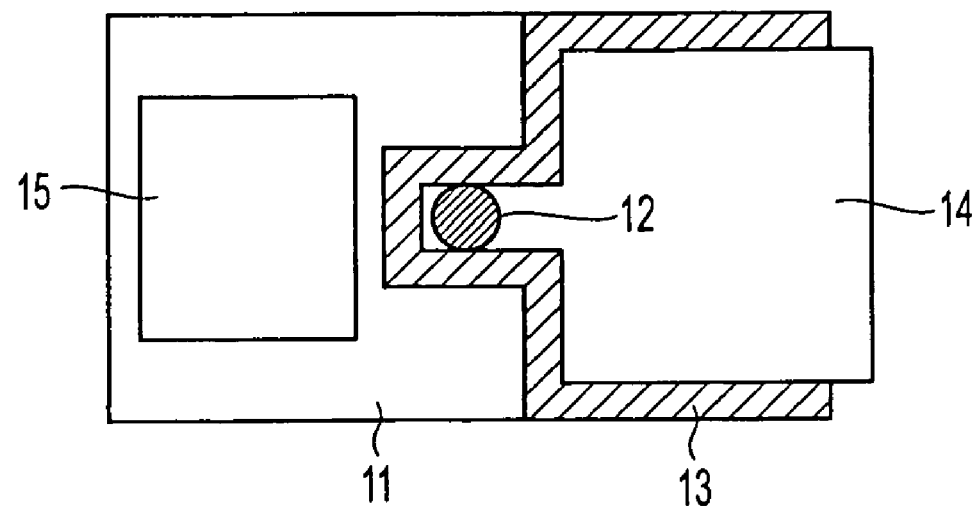

Next, a wiring forming method for a tile-shaped element and a wiring structure for a tile-shaped element in accordance with a second exemplary embodiment of the invention are described below with reference to FIGS. 3A–B through FIGS. 5A–B. First, a micro tile-shaped element 1a to which the wiring forming method of the present exemplary embodiment is applied is described. FIGS. 3A–B show an example of a micro tile-shaped element in accordance with the second exemplary embodiment. The micro tile-shaped element 1a is a minute semiconductor element in a tile configuration. The micro tile-shaped element 1a is formed from a plate-like member having a thickness of 20 μm or less, and a size in width and length of several ten μm to several hundred μm. In a method for manufacturing the micro tile-shaped element 1a, a sacrificial layer is formed on a semiconductor substrate (first substrate), and a functional layer (electronic functional section) that defines the micro tile-shaped element 1a is stacked on an upper layer of the sacrificial layer. Then, by etching the sacrificial layer, a part of the functional layer is separated from the semiconductor substrate, and the micro tile-shaped element 1a is completed. The method for manufacturing the micro tile-shaped element 1a that uses such an epitaxial lift-off (ELO) method is described in detail below.

In the second exemplary embodiment, an example in which the micro tile-shaped element 1a is equipped with a surface-emitting laser (VCSEL: vertical-cavity surface-emitting laser) is described. However, the invention is not limited to this exemplary embodiment. The micro tile-shaped element 1a is equipped with a tile section 11 composed of an n-type semiconductor, an active layer (not shown in the figure), a p-type semiconductor 12, an insulation layer (insulation section) 13, an anode electrode (electrode) 14, and a cathode electrode (electrode) 15.

The tile section 11 includes a DBR (Distributed Bragg Reflector) mirror composed of n-type AlGaAs multilayer films, for example. The active layer is stacked on the tile section 11. The active layer is deposited in a thin columnar configuration in a region near the center of an upper surface of the tile section 11, and may be composed of AlGaAs, for example. The p-type semiconductor 12 is stacked on an upper surface of the active layer in a columnar configuration on the tile section 11, and composes a DBR mirror composed of p-type AlGaAs multilayer films, for example. An optical resonator, which is a surface-emitting laser, is formed with the tile section 11 composed of the n-type semiconductor, the active layer, and the p-type semiconductor 12.

The cathode electrode 15 is provided on the upper surface of the tile section (n-type semiconductor) 11. Specifically, the cathode electrode 15 is provided in a region other than the region of the upper surface of the tile section 11 where the above-described active layer and the p-type semiconductor 12 are formed. Specifically, in a region other than the central area in the upper surface of the tile section 11. The cathode electrode 15 ohmically contacts the n-type semiconductor that forms the tile section 11.

An insulation layer 13 is provided on an upper surface of the tile section 11, and reduces the likelihood or prevents the anode electrode 14 side from being short-circuited with the tile section 11 (n-type semiconductor) side. The insulation layer 13 is formed to extend from an area adjacent to the center of the upper surface of the tile section 11 toward one end of the tile section 11, and to cover a side surface of the tile section 11. The insulation layer 13 may be formed from a material that is composed of polyimide, resin, glass, ceramics, silicon oxide ($SiO_2$), or the like, for example. An exposed surface in the surface of the insulation layer 13 may have a liquid-repellent property. As a result, the exposed surface of the insulation layer 13 is disposed in a manner to surround a part of the wiring region outside the anode electrode 14 that forms a part of the wiring region, and liquid material to form a wiring dripped inside the wiring region is prevented from flowing out of the wiring region. Because the insulation layer 13 is disposed in a manner to separate the anode electrode 14 from the cathode electrode 15, the insulation layer 13 causes an action to reduce the likelihood or prevent the liquid material from being formed in a manner to short-circuit the anode electrode 14 and the cathode electrode 15. It is noted here that the insulation layer 13 may be formed from a material that essentially has a liquid-repellent property, a material that is difficult to become lyophilic, or a material that readily becomes liquid-repellent. A liquid-repelling treatment may be applied to the exposed surface of the insulation layer 13.

The anode electrode 14 is provided in a manner to cover the upper surface of the p-type semiconductor 12 and the upper surface of the insulation layer 13 with a single metal film. The anode electrode 14 ohmically contacts the p-type semiconductor 12. The anode electrode 14 and the cathode electrode 15 maybe gold electrodes composed of gold (Au). This is to reduce the likelihood or prevent surfaces of the anode electrode 14 and the cathode electrode 15 from becoming liquid-repellent by a liquid-repelling treatment (a liquid-repelling treatment to be conducted on the entire micro tile-shaped element 1$a$) to be described below, as the surfaces of the anode electrode 14 and the cathode electrode 15 become a part of a wiring region where an electrical wiring is formed. Also, insulation films, such as natural oxidation films are difficult to be formed on the surfaces of the anode electrode 14 and the cathode electrode 15, causing an effect to reduce contact resistance with the electrical wiring. Also, the anode electrode 14 and the cathode electrode 15 maybe formed from a material that essentially has a lyophilic property, a material that is difficult to become liquid-repellent, or a material that readily becomes lyophilic. Also, a lyophilic treatment may be applied to the surfaces of the anode electrode 14 and the cathode electrode 15.

A lyophilic treatment may be applied to the entire surface or the entire exposed surface of the micro tile-shaped element 1$a$. Then a liquid repelling treatment may be applied to a region other than the wiring region (such as the anode electrode 14 and the cathode electrode 15) or a region surrounding the wiring region. In reverse, a liquid repelling treatment may be applied to the entire surface or the entire exposed surface of the micro tile-shaped element 1$a$. Then a lyophilic treatment may be applied only to the wiring region.

Next, the micro tile-shaped element 1$a$ formed as described above is bonded to a final substrate 50. FIGS. 4A–B are schematics in which the micro tile-shaped element 1$a$ is bonded to the final substrate 50. The final substrate 50 is not particularly limited and any optional material, such as silicon, ceramics, glass, glass epoxy, plastic, polyimide or the like can be applied. It is assumed that an electronic device, an electro-optical device, electrodes, an integrated circuit (not shown in the figure), or the like may be provided on the final substrate 50.

Electrodes 51 and 52 are provided at desired positions in the surface of the final substrate 50. The electrode 51 is an electrode that is connected with the anode electrode 14 of the micro tile-shaped element 1$a$. The electrode 52 is an electrode that is connected to the cathode electrode 15 of the micro tile-shaped element 1$a$. The electrodes 51 and 52 may be gold electrodes with their uppermost surfaces being formed from gold (Au). The gold electrodes can be formed by a plating method. This is to reduce the likelihood or prevent surfaces of the electrodes 51 and 52 from becoming liquid-repellent by a liquid-repelling treatment (a liquid-repelling treatment to be conducted on the entire final substrate 50) to be described below, as the surfaces of the electrodes 51 and 52 become a part of the wiring region described above. Insulation films, such as natural oxidation films, are difficult to form on the surfaces of the electrodes 51 and 52, causing an effect to reduce contact resistance with the electrical wiring. The electrodes 51 and 52 may be formed from a material that essentially has a lyophilic property, a material that is difficult to become liquid-repellent, or a material that readily becomes lyophilic. A lyophilic treatment may be applied to the surfaces of the electrodes 51 and 52. An alloy including gold, platinum, silver, copper, nickel, or the like can be used as the material of the electrode 51 and 52.

A lyophilic treatment may be applied to the entire surface or the entire exposed surface of the final substrate 50. Then a liquid-repelling treatment may be applied to a region other than the wiring region (such as the electrodes 51 and 52) or a region surrounding the wiring region. In reverse, a liquid-repelling treatment may be applied to the entire surface or the entire exposed surface of the final substrate 50, and then a lyophilic treatment may be applied only to the wiring region. The lyophilic treatment or the liquid-repelling treatment to the entire body may be conducted on the entire body of the micro tile-shaped element 1$a$ and the final substrate 50 after the micro tile-shaped element 1$a$ is bonded to the final substrate 50.

The micro tile-shaped element 1$a$ and the final substrate 50 may be connected together by, for example, adhesive, by adhering the bottom of the micro tile-shaped element 1$a$ and the surface of the final substrate 50. In this bonding, it is desirable that a side section, that is, a protruded section of the insulation layer 13 in the micro tile-shaped element 1$a$, comes in contact with the surface of the final substrate 50. As a result, when the micro tile-shaped element 1$a$ is bonded to the final substrate 50, the insulation layer 13 of the semiconductor element automatically adheres to the surface of the final substrate 50 and the side surface of the tile section 11, and the insulation layer 13 automatically covers the end section of the tile section 11.

When the micro tile-shaped element 1a and the final substrate 50 are bonded together, a separation d1 between an end section of the anode electrode 14 of the micro tile-shaped element 1a and an end section of the electrode 51 of the final substrate 50 maybe, for example, several ten µm or less. Also, a separation d2 between an end section of the cathode electrode 15 of the micro tile-shaped element 1a and an end section of the electrode 52 of the final substrate 50 may be, for example, several ten µm or less. Separations between the electrodes of the micro tile-shaped element and the electrodes of the final substrate 50 may be as short as possible, for example, several ten µm or less.

Next, as shown in FIGS. 5A–B, liquid material 53 and 54 are dripped in wiring regions to apply the liquid material 53 and 54 on the wiring regions. FIGS. 5A–B are schematics of a wiring forming method in accordance with a second exemplary embodiment of the invention, and a circuit device (thin film device) that is manufactured by the wiring forming method. Specifically, a region where an electrical wiring to connect the anode electrode 14 of the micro tile-shaped element 1a and the electrode 51 of the final substrate 50 is formed is a wiring region 61. Also, a region where electrical wiring to connect the cathode electrode 15 of the micro tile-shaped element 1a and the electrode 52 of the final substrate 50 is formed is a wiring region 62. Droplets of the liquid material 53 including electroconductive material are discharged from an ink jet nozzle or the like, to hit the droplets inside the wiring region 61. Droplets of the liquid material 54 including electroconductive material are discharged from an ink jet nozzle or the like, to hit the droplets inside the wiring region 62.

If a lyophilic treatment has been applied to areas inside the wiring regions 61 and 62, the liquid material 53 and 54 arrived in the wiring regions 61 and 62 wets and spreads the entire areas inside the wiring regions 61 and 62, such that the liquid material 53 and 54 can be applied to the entire areas of the wiring regions 61 and 62 without leakage. Also, if a liquid-repelling treatment has been applied to areas surrounding the wiring regions 61 and 62, the areas that have been treated with the liquid-repelling treatment causes an effect such that the liquid material 53 and 54 flowing within the wiring regions 61 and 62 finds it difficult to flow out of the wiring regions 61 and 62. Even if a part or all of the liquid material 53 and 54 hits outside the wiring regions 61 and 62, the liquid material 53 and 54 is subject to an effect that repels the liquid material 53 and 54 out of the areas treated with the liquid-repelling treatment, into the wiring regions 61 and 62.

Consequently, in accordance with the present exemplary embodiment, the liquid material 53 and 54 can be accurately applied only inside the wiring regions 61 and 62. Also, by making the wiring regions 53 and 54 to be lyophilic, adhesion between the liquid material 53 and 54 and the wiring regions 61 and 62 can be enhanced.

After applying the liquid material 53 and 54 to the wiring regions 61 and 62 as described above, a drying process and a heating (sintering) process are conducted for the liquid material 53 and 54. By this, the liquid material 53 and 54 containing electroconductive material becomes electroconductive films, such as metal films, and becomes electrical wirings. By the processes described above, an electrical wiring that connects the electrode 51 of the final substrate 50 and the anode electrode 14 of the micro tile-shaped element 1a is completed, and an electrical wiring that connects the electrode 52 of the final substrate 50 and the cathode electrode 15 of the micro tile-shaped element 1a is completed. Consequently, a circuit device (thin film device) that is composed of the final substrate 50 and the micro tile-shaped element 1a that is electrically and mechanically connected to the final substrate 50 is also completed.

Consequently, in accordance with the present exemplary embodiment, the liquid material 53 and 54 can be accurately applied only inside the wiring regions 61 and 62, and adhesion between the liquid material 53 and 54 and the surfaces of the wiring regions 61 and 62 can be enhanced, such that highly reliable electrical wirings that connect the electrodes of the micro tile-shaped element 1a and the electrodes of the final substrate 50 can be formed in a minute wiring pattern.

In the exemplary embodiment described above, if the separation d1 between the end section of the anode electrode 14 of the micro tile-shaped element 1a and the end section of the electrode 51 of the final substrate 50 and the separation d2 between the end section of the cathode electrode 15 of the micro tile-shaped element 1a and the end section of the electrode 52 of the final substrate 50 are set to be several ten µm or less, regions interposed between the respective two electrodes (parts of the wiring regions) may be in a liquid-repellent state. When the liquid material 53 and 54 is dripped in areas near the regions interposed between the two electrodes, the liquid material 53 and 54 is formed in a manner to connect the two electrodes by surface tension of the liquid material 53 and 54, whereby the electrical wirings can be formed.

Examples of Liquid-Repelling Treatment and Lyophilic Treatment

Initially, the electrodes 51 and 52 of the final substrate 50 are formed from gold electrodes composed of gold (Au). Areas around the electrodes 51 and 52 are provided with a structure in which the insulation film, such as, for example, $SiO_2$ is exposed. The final substrate 50 and the micro tile-shaped element 1a are disposed such that the electrodes 51 and 52 of the final substrate 50 and (the electrodes of) the micro tile-shaped element 1a are in proximity to one another when they are bonded. For example, they may be bonded such that the tile section 11 of the tile-shaped element 1a and the electrodes 51 and 52 of the final substrate 50 are in contact with one another. Alternatively, they may be bonded such that a part of the tile section 11 of the tile-shaped element 1a and a part of the electrodes 51 and 52 of the final substrate 50 overlap one another. Alternatively, they may be bonded such that a part of the anode electrode 14 or the cathode electrode 15 of the tile-shaped element 1a and a part of the electrodes 51 and 52 of the final substrate 50 overlap one another. It is noted that, when they are bonded, the electrode 51 or the electrode 52 of the final substrate should not be short-circuited with the back surface of the tile section 11 or the like.

After the micro tile-shaped element 1a has been bonded to the desired position on the final substrate 50 as described above, a process to form a self-assembled monolayer over the entire surface of the final substrate 50 and the micro tile-shaped element 1a is conducted. Self-assembled monolayers (SAMs) are films that are formed by a self-assembly (SA) method which is a method to immobilize molecules to a surface of a solid body, and which is a method with which highly oriented, high-density molecular layers can be formed. The self-assembly method can manipulate the environment and the geometry of molecules in the order of angstroms. Also, self-assembled monolayers provide a powerful device in the organic molecules immobilization technology, can be manufactured by a simple method, has high thermal stability due to chemical bonding present between the molecules and the substrate, and provide an important technology for manufacturing molecular devices on the order of angstroms. Self-assembled monolayers are basically formed through a self-aggregation process, and can spontaneously be formed into minute patterns. With self-assembled monolayers, dense and highly complicated patterns that may be used in super-micro electronic circuits can be readily formed in areas where the related art lithography technique cannot be used.

Next, a concrete example of a process of forming a self-assembled monolayer is described. This process is conducted through exposing the surface of the final substrate 50 that has been bonded to the micro tile-shaped element 1a to vapor of fluoroalkylsilane (FAS). Fluoroalkylsilane has a molecular structure in which a fluoro group attaches to one end of a chain alkyl molecule and silicon attaches to the other end. Then, only the silicon ends bond with OH groups that exist in the surface of the final substrate 50. The surface of the micro tile-shaped element 1a is also included. The same applies in the descriptions below. As a result, a monomolecular film (a fluoroalkylsilane film) is formed on the surface of the final substrate 50 in a manner that the fluoro groups are automatically oriented to expose. Because the fluoro groups are exposed, the surface of the final substrate 50 having the monomolecular film formed thereon has a large contact angle against most liquid bodies, and therefore in a liquid-repellent state.

Also, an insulation layer of $SiO_2$ or the like is exposed on the surface of the final substrate 50. Because OH groups exist in the surface of the insulation layer of $SiO_2$ or the like, the monomolecular film of fluoroalkylsilane is formed on the surface, and becomes repellent to liquid. Since the insulation layer of $SiO_2$ or the like is initially exposed in areas around the electrodes 51 and 52 of the final substrate 50 (and the electrodes of the micro tile-shaped element 1a) and areas around the wiring regions, the areas around the electrodes 51 and 52 of the final substrate 50 (and the electrodes of the micro tile-shaped element 1a) and the areas around the wiring regions become repellent to liquid.

OH groups do not exist in the gold electrodes (electrodes 51 and 52) of the final substrate 50 and the gold electrodes (anode electrode 14 and cathode electrode 15) of the micro tile-shaped element 1a. Therefore a monomolecular film of fluoroalkylsilane is not formed on their surfaces, and they are in a lyophilic state due to the intrinsic characteristic of gold.

Next, liquid paste including metal fine particles, specifically, the liquid material 53 and 54 is dripped onto the surfaces of the gold electrodes that are in a lyophilic state described above. The dripping may be conducted through discharging the liquid material 53 and 54 from an ink jet nozzle or the like. As a result, the droplets accumulate only on the surfaces of the gold electrodes, and the droplets would not overflow from the gold electrodes.

Furthermore, when the separations d1 and d2 between the electrodes 51 and 52 of the final substrate 50 and the anode electrode 14 and the cathode electrode 15 of the micro tile-shaped element 1a, respectively, are several ten μm or less, and when droplets (liquid paste) are formed by the above-described dripping in a manner to connect the electrode 51 and the anode electrode 14 and to connect the electrode 52 and the cathode electrode 15, the shape of the droplets can be maintained due to surface tension thereof, even when the regions interposed between the respective two electrodes are in a liquid-repellent state. As shown in FIGS. 5A–B, the liquid paste (liquid material 53 and 54) is applied to the entire areas of the wiring regions 61 and 62.

Then, the final substrate 50 is subject to a drying process. Then a heating process is conducted to sinter the liquid paste in the wiring regions 61 and 62, to change them to electrical wirings composed of electroconductive films.

In this manner, the liquid-repelling treatment (and the lyophilic treatment) causes an effect to attract and retain the liquid material 53 and 54 to the electrodes of the final substrate 50 and the micro tile-shaped element 1a, such that the electrical wirings that mutually connect the electrodes can be formed in a self-alignment manner with a high accuracy. As the material of the insulation layer that is exposed in areas around the electrodes 51 and 52, SiN, polyimide, epoxy, alumina and a variety of ceramics may be enumerated, in addition to $SiO_2$. Also, before conducting a process to form the self-assembled monolayer, the surface of the final substrate 50 may be exposed to ozone or $O_2$ plasma. By so doing, much more OH groups are generated in the surfaces other than the gold electrodes (such as the electrodes 51 and 52), and a fluoroalkylsilane film is more readily formed on the surfaces, such that the liquid-repellent state can be excellently provided.

Third Exemplary Embodiment

Figure 6:
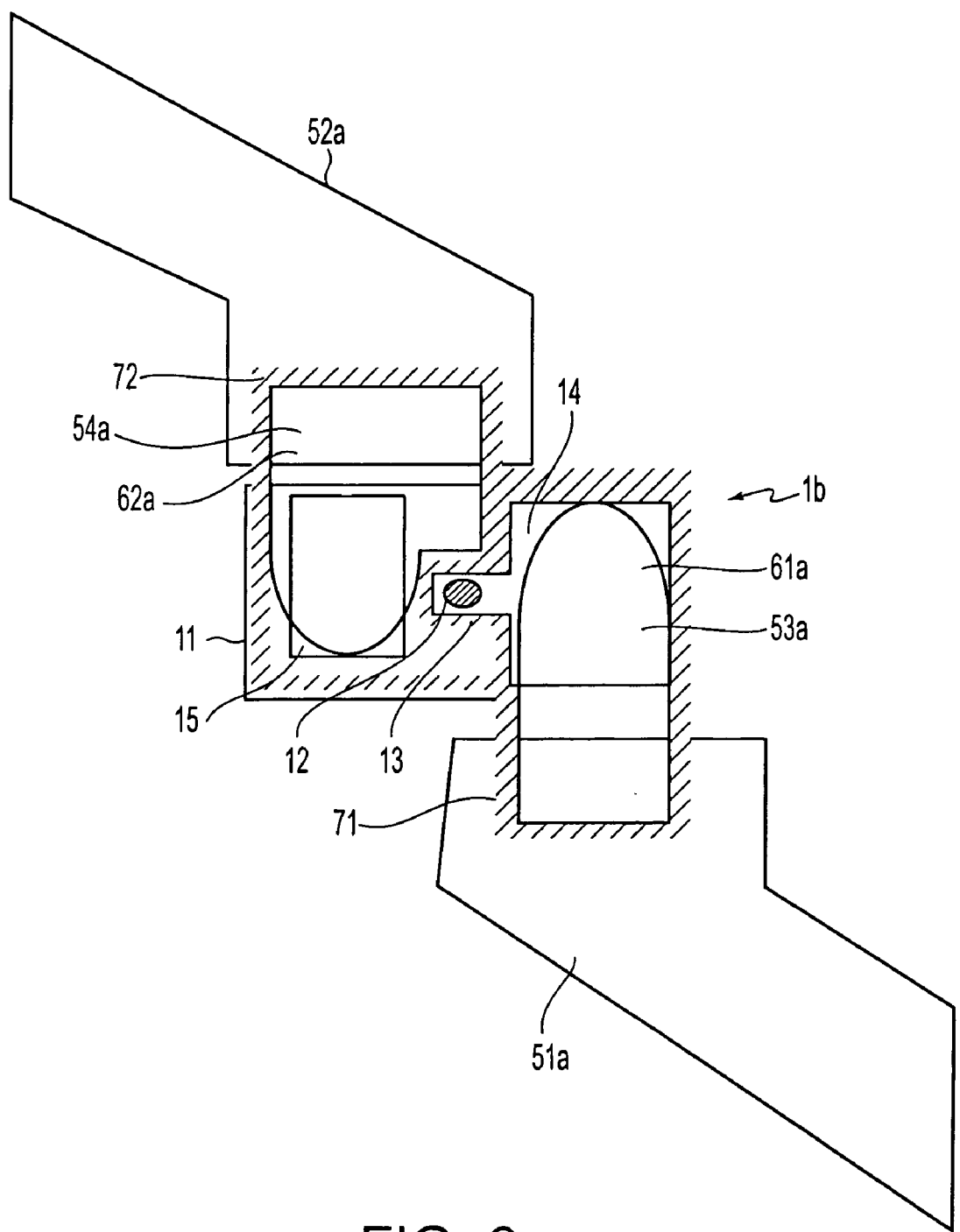
FIG. 6 is a schematic illustrating a circuit device in accordance with a third exemplary embodiment of the invention.

Next, another example of a wiring structure for a tile-shaped element formed by the wiring forming method for a tile-shaped element described above is described below with reference to FIG. 6. FIG. 6 is a schematic of a circuit device in accordance with a third exemplary embodiment of the invention. In the present exemplary embodiment, in particular, the arrangement of wiring regions 61a and 62a is different from that of the circuit device shown in FIGS. 5A–B. In the present circuit device, a micro tile-shaped element 1b is bonded to a final substrate 50. Differences of the micro tile-shaped element 1b from the micro tile-shaped element 1a shown in FIGS. 3A–B reside in the arrangement of an insulation layer 13 and the arrangement of the wiring regions 61a and 62a. Also, a liquid-repellent film 71 is provided in a manner to surround the wiring region 61a, and a liquid-repellent film 72 is provided in a manner to surround the wiring region 62a.

The layout of electrodes 51a and 52a of the final substrate 50 is also different from the layout of the electrodes 51 and 52 of the final substrate 50 shown in FIGS. 5A–B. Liquid material 53a is applied to the wiring region 61a surrounded by the liquid-repellent film 71 to form an electrical wiring, thereby connecting the electrode 51a of the final substrate 50 and an anode electrode 14 of the micro tile-shaped element 1b. Also, liquid material 54a is applied to the wiring region 62a surrounded by the liquid-repellent film 72 to form an electrical wiring, thereby connecting the electrode 52a of the final substrate 50 and a cathode electrode 15 of the micro tile-shaped element 1b.

Consequently, in accordance with the present exemplary embodiment, the wiring regions 61a and 62a surrounded by the liquid-repellent films 71 and 72 are disposed opposite to each other through a corner section of the tile section 11 of the micro tile-shaped element 1b. Accordingly, in accordance with the present exemplary embodiment, even if liquid material overflows from one of the wiring regions 61a and 62b, the corner section of the tile section 11 reduces the likelihood or prevents the overflow from flowing to and entering the other of the wiring regions 61a and 62a, such that a highly reliable circuit device that can avoid short-circuits can be readily manufactured at low costs.

Details of Method for Manufacturing Micro Tile-Shaped Element and Circuit Device Next, a method for manufacturing a micro tile-shaped element in accordance with an exemplary aspect of the invention, and a method for manufacturing a circuit device using a wiring forming method in accordance with an exemplary aspect of the invention are described with reference to FIG. 7 to FIG. 16. The manufacturing methods are based on an epitaxial lift-off (ELO) method. Also in the present exemplary manufacturing methods, a case where a compound semiconductor device (compound semiconductor element) as a micro tile-shaped element (micro tile element) is adhered to a final substrate is described. However, the present exemplary manufacturing methods are applicable regardless of the type and configuration of the final substrate. It is noted that the "semiconductor substrate (epitaxial substrate)" in the present exemplary embodiment refers to an object that is composed of semiconductor material. However, the "semiconductor substrate" is not limited to a substrate in a plate shape, and any configurations can be included in the "semiconductor substrate" so long as they are composed of semiconductor material.

First Step

Figure 7:
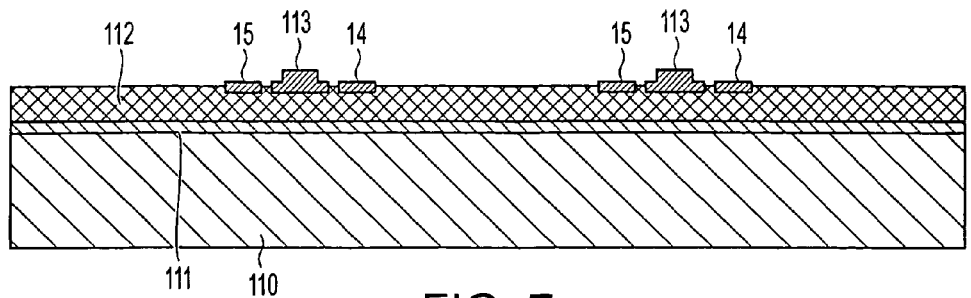
FIG. 7 is a schematic illustrating a first step of a method for manufacturing a micro tile-shaped element and a circuit device in accordance with an exemplary embodiment of the invention.

FIG. 7 is a schematic showing a first step of the present exemplary manufacturing method. In FIG. 7, a substrate 110 is a semiconductor substrate, and may be, for example, a gallium arsenide compound semiconductor substrate. A sacrificial layer 111 is provided in the lowermost layer in the substrate 110. The sacrificial layer 111 is composed of aluminum arsenide (AlAs), and has a thickness of, for example, several hundred nm.

For example, a functional layer 112 is provided in an upper layer of the sacrificial layer 111. The functional layer 112 may have a thickness of about 1 µm to 10 (20) µm, for example. Semiconductor devices 113 are formed with the functional layer 112. As the semiconductor device 113, for example, a light emitting diode (LED), a surface emitting laser (VCSEL), a photodiode (PD), and a DFB laser can be enumerated. Any of the aforementioned semiconductor devices 113 is formed by stacking multiple epitaxial layers on the substrate 110. Also, an anode electrode 14 and a cathode electrode 15, corresponding to a micro tile-shaped element 1a shown in FIGS. 1A–B, for example, are also formed in each of the semiconductor devices 113, and their operation test is conducted.

Second Step

Figure 8:
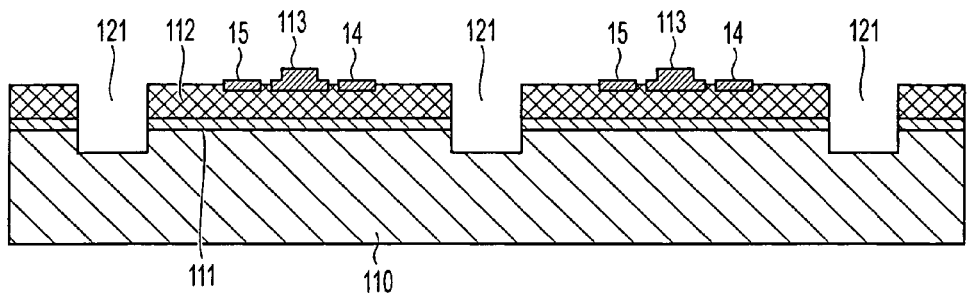
FIG. 8 is a schematic illustrating a second step of the above manufacturing method.

FIG. 8 is a schematic showing a second step of the present exemplary manufacturing method. In this step, separation grooves 121, that separate the semiconductor devices 113 from one another, are formed. The separation grooves 121 are grooves that have a depth reaching at least the sacrificial layer 111. For example, the width and depth of the separation grooves may be 10 µm to several hundred µm. Also, the separation grooves 32 may be connected to each other without dead ends so that the selective etching solution to be described below flows through the separation grooves 121. Furthermore, the separation grooves 121 may be formed in a grid-like shape, like the one on a chessboard.

Further, the interval of the separation grooves 121 may be several ten µm to several hundred µm, such that the size of each of the semiconductor devices 113 separated and formed by the separation grooves 121 may have an area of several ten µm to several hundred µm square. The separation grooves 121 may be formed by a method including photolithography and wet etching, or a dry etching method. Also, the separation grooves 121 may be formed in U-shaped grooves by dicing in a range that does not cause any cracks in the substrate.

Third Step

Figure 9:
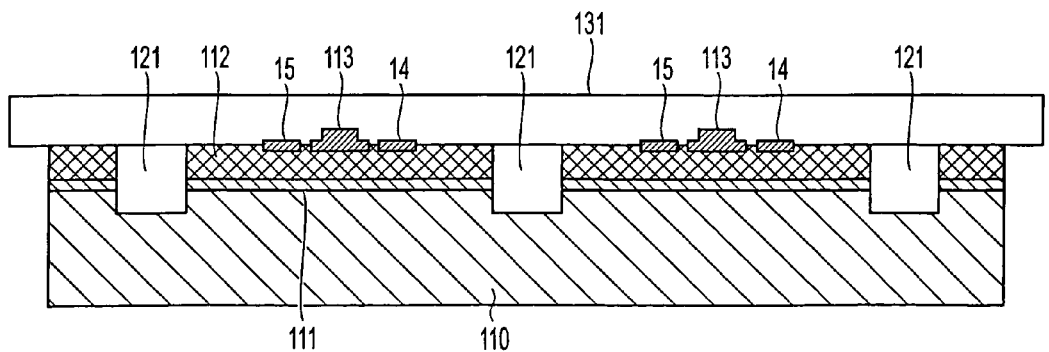
FIG. 9 is a schematic illustrating a third step of the above manufacturing method.

FIG. 9 is a schematic showing a third step o,f the present exemplary manufacturing method. In this step, an intermediate transfer film 131 is boded to a surface (on the side where the semiconductor devices 113 are formed) of the substrate 110. The intermediate transfer film 131 is a flexible band-shaped film having a surface coated with an adhesive.

Fourth Step

Figure 10:
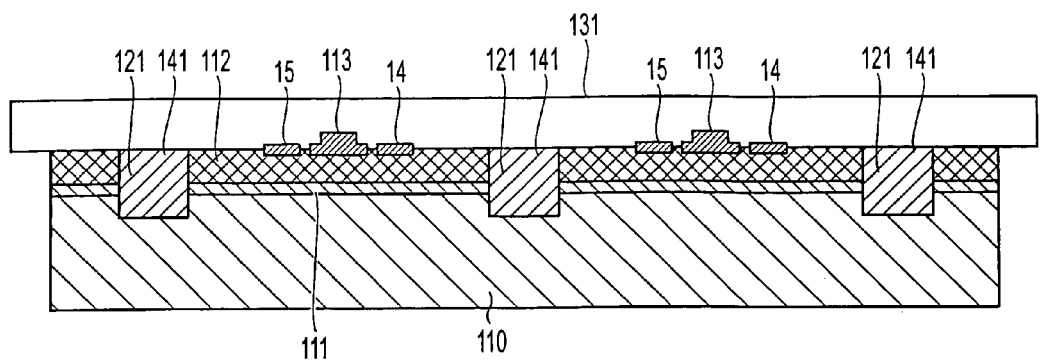
FIG. 10 is a schematic illustrating a fourth step of the above manufacturing method.

FIG. 10 is a schematic showing a fourth step of the present exemplary manufacturing method. In this step, a selective etching solution 141 is injected into the separation grooves 121. In this step, low concentration hydrochloric acid having a high selectivity to aluminum arsenide is used as the selective etching solution 141 to selectively etch only the sacrificial layer 111.

Fifth Step

Figure 11:
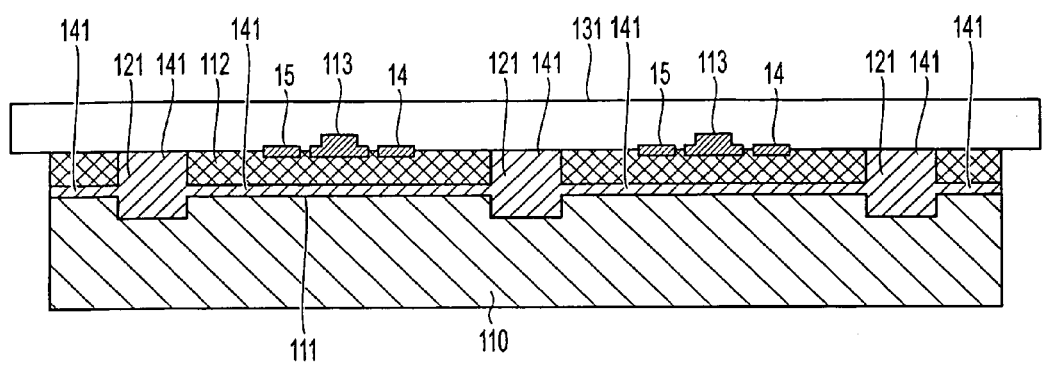
FIG. 11 is a schematic illustrating a fifth step of the above manufacturing method.

FIG. 11 is a schematic showing a fifth step of the present exemplary manufacturing method. In this step, the sacrificial layer 111 is entirely removed by selective etching from the substrate 10 after the passage of a predetermined time from the injection of the selective etching solution 141 into the separation grooves 121 in the fourth step.

Sixth Step

Figure 12:
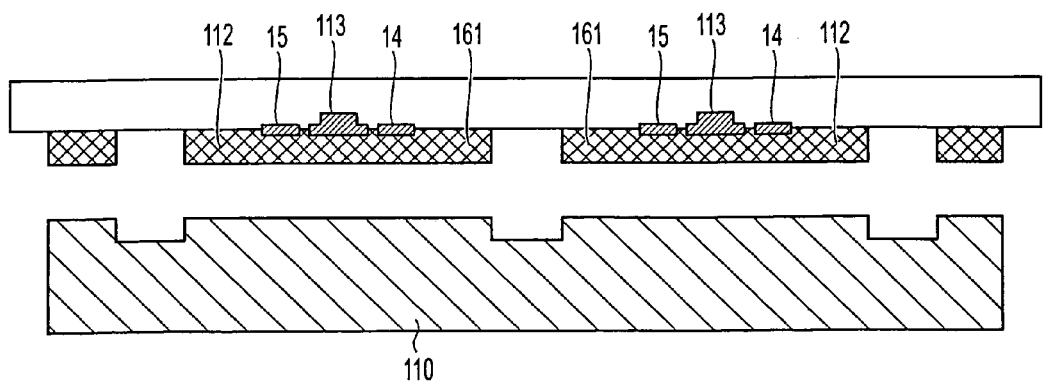
FIG. 12 is a schematic illustrating a sixth step of the above manufacturing method.

FIG. 12 is a schematic showing a sixth step of the present exemplary manufacturing method. After the sacrificial layer 111 is entirely etched out in the fifth step, the functional layer 112 is separated from the substrate 110. In this step, the intermediate transfer film 131 is separated from the substrate 110 to separate the functional layer 112 bonded to the intermediate transfer film 131 from the substrate 110.

As a result, the functional layer 112 having the semiconductor devices 113 formed thereon is divided into semiconductor elements (micro tile-shaped elements 161) in predetermined shapes (for example, micro tile configurations) by the separation grooves 121 formed and etching of the sacrificial layer 111, each being adhered to and held by the intermediate transfer film 131. It is noted here that the thickness of the functional layer may be, for example, about 1 µm to about 8 µm, and the size (width and length) may be, for example, several ten µm to several hundred µm.

Seventh Step

Figure 13:
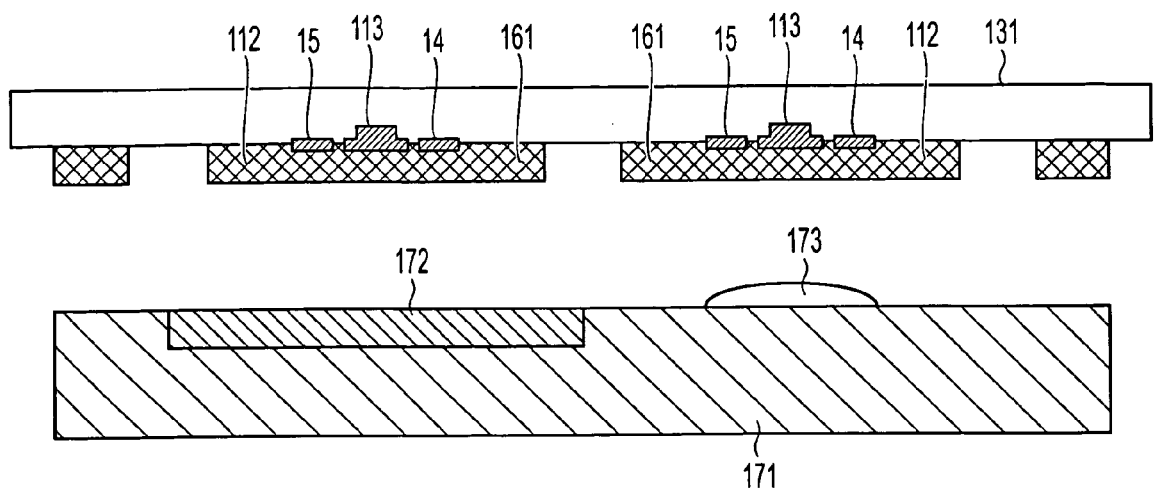
FIG. 13 is a schematic illustrating a seventh step of the above manufacturing method.

FIG. 13 is a schematic showing a seventh step of the present manufacturing method. In this step, the intermediate transfer film 131 (having the micro tile-shaped elements 161 bonded thereto) is moved to align each of the micro tile-shaped elements 161 with a desired position of a final substrate 171. The final substrate 171 is composed of, for example, silicon semiconductor, and includes an electrode 172 that is composed of gold (Au). Also, an adhesive 173 is applied to a desired position of the final substrate 171, for bonding the micro tile-shaped element 161.

Eighth Step

Figure 14:
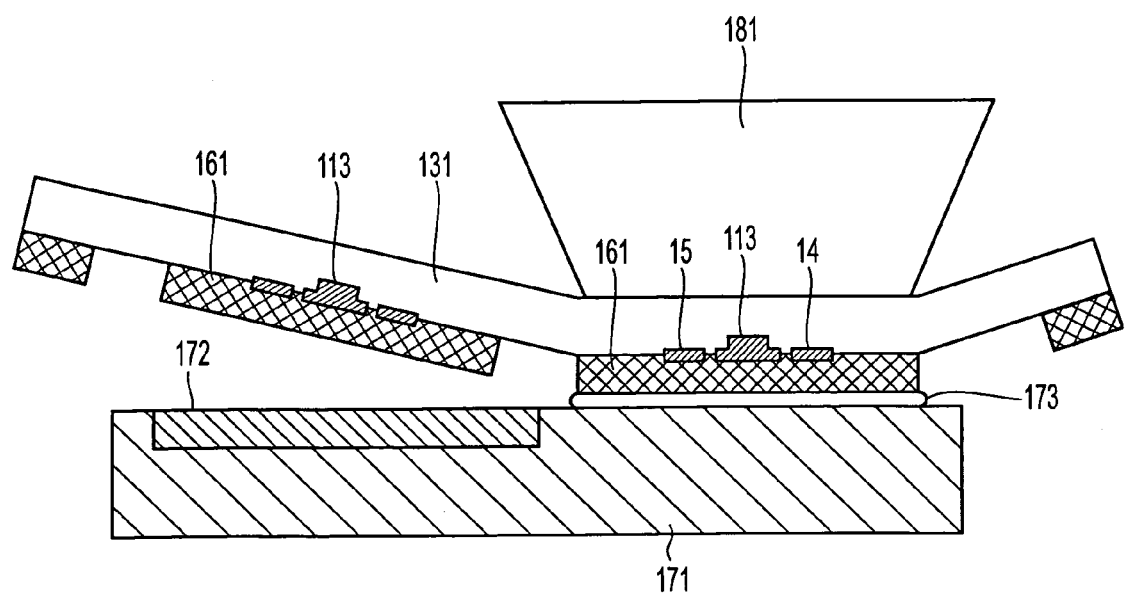
FIG. 14 is a schematic illustrating an eighth step of the above manufacturing method.

FIG. 14 is a schematic showing an eighth step of the present exemplary manufacturing method. In this step, the micro tile-shaped element 161 aligned with the desired position of the final substrate 171 is pressed by a back pressing pin 181 with the intermediate transfer film 131 provided therebetween, and is bonded to the final substrate 171. Because the adhesive 173 is applied to the desired position, the micro tile-shaped element 161 is adhered to the desired position of the final substrate 171.

Ninth Step

Figure 15:
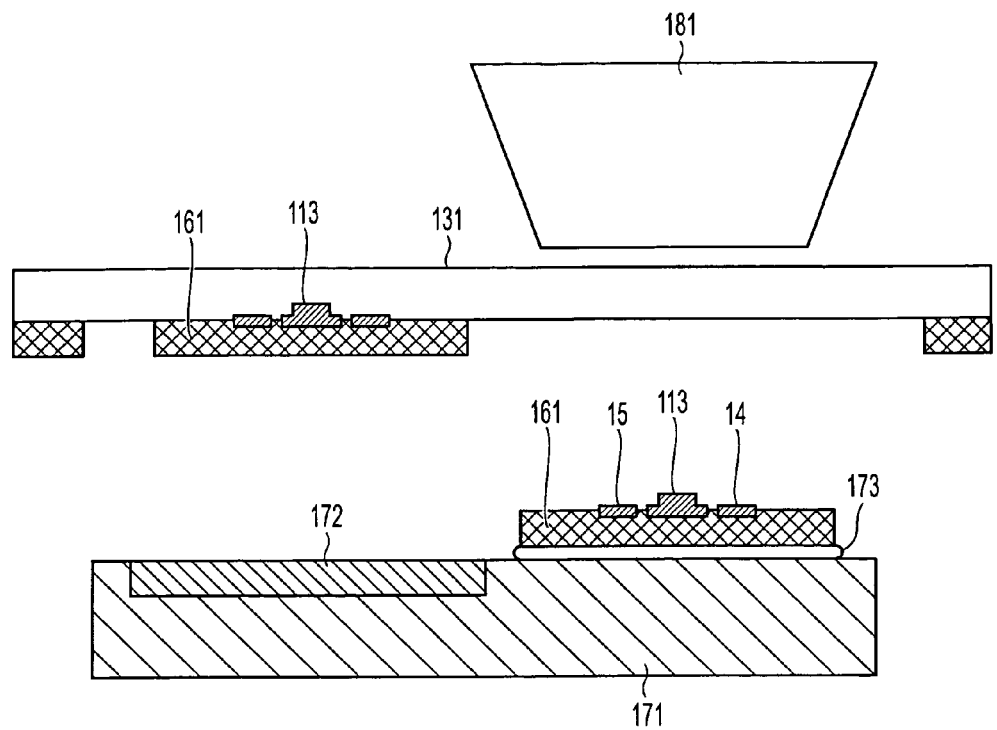
FIG. 15 is a schematic illustrating a ninth step of the above manufacturing method.

FIG. 15 is a schematic showing a ninth step of the present exemplary manufacturing method. In this step, the adhesive force of the intermediate transfer film 131 is lost to separate the intermediate transfer film 131 from the micro tile-shaped element 161.

The adhesive of the intermediate transfer film 131 may be UV settable or heat settable. With the UV settable adhesive, the back pressing pin 181 may be formed from a transparent material, and an ultraviolet ray (UV) is applied through the end of the back pressing pin 181 to lose the adhesive force of the intermediate transfer film 131. With the heat settable adhesive, the back pressing pin 181 may be heated. Alternatively, after the sixth step, the entire surface of the intermediate transfer film 131 may be irradiated with an ultraviolet ray to lose the adhesive force of the entire surface. Although the adhesive force is lowered, adhesion actually slightly remains, so that the micro tile-shaped element 161 is held onto the intermediate transfer film 131 because the micro tile-shaped element 161 is very thin and lightweight.

Tenth Step

This step is not illustrated. In this step, the micro tile-shaped element 161 is finally bonded to the final substrate 171 by a heat treatment or the like.

Eleventh Step

Figure 16:
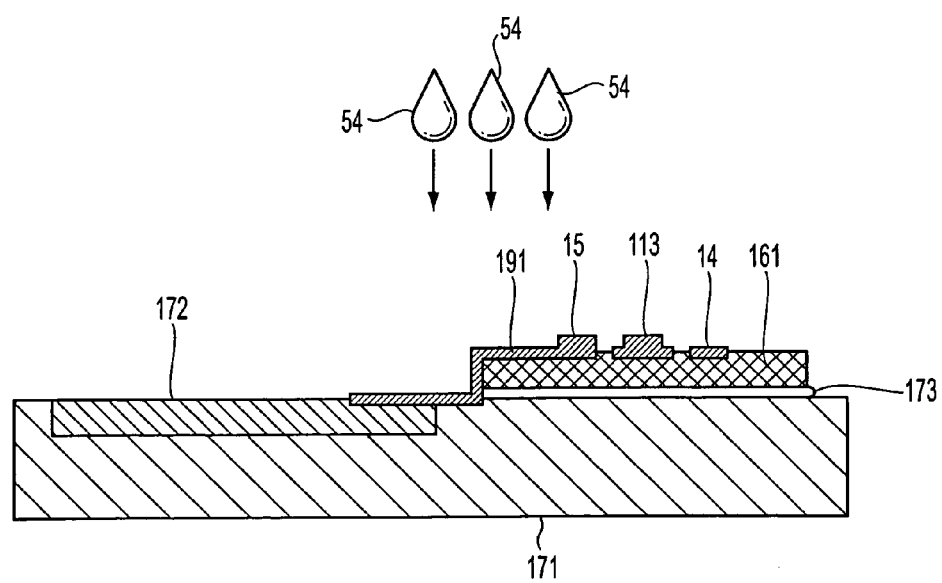
FIG. 16 is a schematic illustrating an eleventh step of the above manufacturing method.

FIG. 16 is a schematic showing an eleventh step of the present exemplary manufacturing method. In this step, the electrode (for example, the cathode electrode 15) of the micro tile-shaped element 161 is electrically connected to the electrode 172 on the final substrate 171 with an electrical wiring 191, thereby completing one LSI chip (a circuit device or a thin film device).

When the electrical wiring 191 is provided, the wiring forming method for a tile-shaped element in accordance with an exemplary aspect of the invention described above is used. That is, liquid material 54 is applied to a wiring region, and then the liquid material 54 is set to thereby provide the electrical wiring 191. Specifically, before the electrical wiring 191 is formed, a liquid repelling treatment is conducted on the surfaces of the final substrate 171 and the micro tile-shaped element 161 in a manner to surround the wiring region that is a region where the electrical wiring 191 is formed. Here, the anode electrode 14, the cathode electrode 15, and the electrode 172 are formed with gold electrodes, and the surfaces of the final substrate 171 and the micro tile-shaped element 161 maybe exposed to vapor of fluoroalkylsilane (FAS), such that a liquid-repellent film composed of a self-assembled monolayer may be formed in a manner to surround the wiring regions. Here, the surfaces of the anode electrode 14, the cathode electrode 15, and the electrode 172 are in a lyophilic state. Then, the liquid material 54 including electroconductive material is dripped in the wiring region, to apply the liquid material 54 within the wiring region. Then, a drying process and a sintering process are conducted on the liquid material 54, whereby the electrical wiring 191 composed of an electroconductive film is formed. Consequently, a circuit device or a thin film device that defines one LSI chip or the like is completed.

Consequently, even when the final substrate 171 is composed of silicon, a micro tile-shaped element 161 equipped with a gallium arsenide surface-emitting laser may be formed at a desired location on the final substrate 171. In other words, a semiconductor element, such as a surface-emitting laser can be formed on a substrate composed of a material different from that of the semiconductor element. Furthermore, since a surface-emitting laser or the like can be completed on a semiconductor substrate and then separated in a micro tile configuration, the surface-emitting laser or the like can be tested and selected in advance prior to forming an integrated circuit that incorporates the surface-emitting laser. Furthermore, in accordance with the manufacturing method described above, only a functional layer that includes micro tile-shaped elements (surface-emitting lasers or the like) may be cut and separated as micro tile elements 161 from the semiconductor substrate, and mounted on a film for handling. Accordingly, the micro tile-shaped elements 161 can be individually selected and bonded to the final substrate 71, and the size of the micro tile-shaped element 161 that can be handled can be made smaller than the one achieved by the related art mounting technology.

Moreover, in accordance with the manufacturing method described above, the electrical wiring 191 that connects the electrode of the micro tile-shaped element 161 and the electrode of the final substrate 171 can be provided in a minute pattern with good adhesion to its forming surface by applying liquid material. Consequently, in accordance with the manufacturing method described above, an integrated circuit equipped with a thin film device (a circuit device) that is compact, has a lower probability of short-circuit and line-breakage, and operates at a high speed can be readily manufactured at low costs, compared to the related art method.

Electronic Apparatus

Examples of an electronic apparatus including the circuit device (thin film device) of any one of the above exemplary embodiments are described below. The thin film device of any of the above exemplary embodiments is applicable to a surface-emitting laser, a light emitting diode, a photodiode, a phototransistor, a high electron mobility transistor, a hetero bipolar transistor, an inductor, a capacitor or a resistance. As an application circuit or an electrical apparatus equipped with the thin film device, an optical interconnection circuit, an optical fiber communication module, a laser printer, a laser beam projector, a laser beam scanner, a linear encoder, a rotary encoder, a displacement sensor, a pressure sensor, a gas sensor, a blood flow sensor, a fingerprint sensor, a high-speed electromodulation circuit, a wireless RF circuitry, a mobile phone, a wireless LAN, etc. can be enumerated.

Figure 17A:
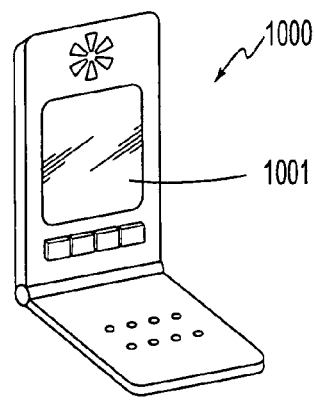
FIGS. 17A–C are schematics illustrating examples of electronic apparatus equipped with semiconductor devices in accordance with the exemplary aspects of invention.
Figure 17B:
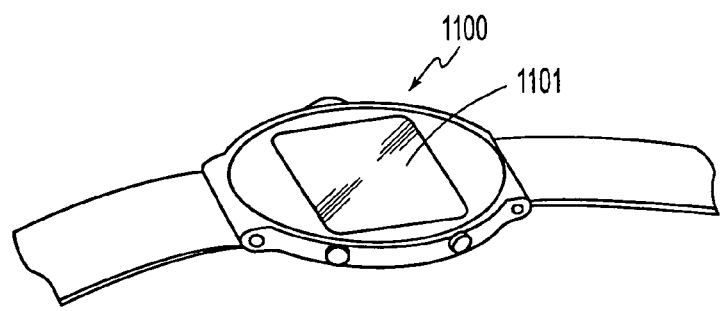
Figure 17C:
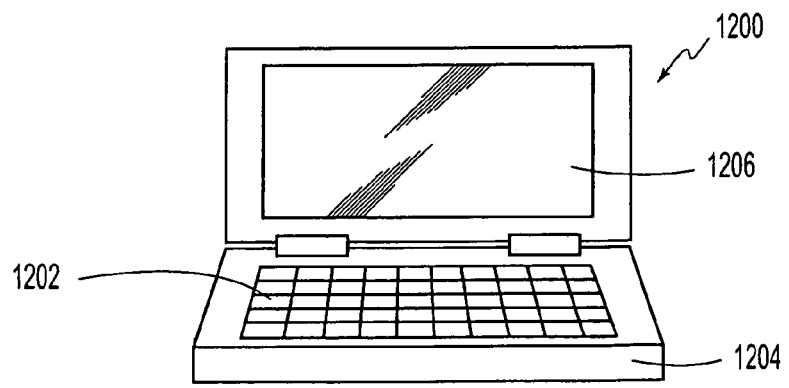

FIG. 17(A) is a schematic showing an example of a cellular phone. In FIG. 17(A), reference numeral 1000 denotes a cellular phone body using the thin film device described above, and reference numeral 1001 denotes a display section. FIG. 17(B) is a schematic showing an example of a wristwatch-type-electronic apparatus. In FIG. 17(B), reference numeral 1100 denotes a watch body using the thin film device described above, and reference numeral 1101 denotes a display section. FIG. 17(C) is a schematic showing an example of a portable information processor, such as a word processor, a personal computer, and the like. In FIG. 17(C), reference numeral 1200 denotes an information processor apparatus. Reference numeral 1202 denotes an input section such as a key board or the like. Reference numeral 1204 denotes an information processor body using the thin film device described above, and reference numeral 1206 denotes a display section.

Any of the electronic apparatus shown in FIGS. 17A–C is equipped with a circuit device (thin film device) of any of the exemplary embodiments described above, such that short-circuits would be difficult to occur, they operate at a high speed, they are thin and compact and can be manufactured at low costs.

The technological range of the invention is not limited to the above-described exemplary embodiments. Various changes can be made within the scope without departing from the subject matter of the invention. The materials and layer structures of the above exemplary embodiments are only examples, and proper changes can be made.

In the exemplary embodiments described above, the structure in which a micro tile-shaped element is equipped with a surface-emitting laser is described. However, the invention is not limited to these exemplary embodiments, and the micro tile-shaped element may include at least one of a light emitting diode, a photodiode, a phototransistor, a high electron mobility transistor, a hetero bipolar transistor, an inductor, a capacitor and a resistance.

Also, in the manufacturing methods (wiring forming methods) in accordance with the exemplary embodiments described above, examples in which electrical wirings that electrically connect a micro tile-shaped element bonded to a final substrate to the final substrate are described. However, the invention is not limited to these, and can be applied to formation of various electrical wirings using a droplet discharging method, such as a wiring for two electrodes formed in advance on a single substrate.

What is claimed is:

1. A circuit device, comprising:
a substrate;
a first electrode disposed on the substrate;
a second electrode disposed on the substrate;
a semiconductor device including a third electrode and a fourth electrode bonded to the substrate by an adhesive;
a first electroconductive film that electrically connects the first electrode and the third electrode; and
a second electroconductive film that electrically connects the second electrode and the fourth electrode,
wherein the semiconductor device includes a first conductive type semiconductor, a second conductive type semiconductor disposed on the first conductive type semiconductor, and an insulator film,
the third electrode is disposed on the first conductive type semiconductor,
the insulator film is formed to cross from an upper surface of the first conductive type semiconductor to at least one side surface of the first conductive type semiconductor, and
the fourth electrode is formed to cross from at least a part of an upper surface of the second conductive type semiconductor to at least a part of an upper surface of the insulator film.

2. The circuit device according to claim 1, wherein the insulator film includes a first part covered by the fourth electrode and a second part that consists of other than the first part, and
an upper surface of the second part has a liquid-repellent property.

3. The circuit device according to claim 1, wherein an upper surface of the third electrode and an upper surface of the fourth electrode have a lyophilic property.

4. The circuit device according to claim 1, wherein an uppermost surface of the first electrode and an uppermost surface of the second electrode are formed from gold.

5. The circuit device according to claim 1, wherein the semiconductor device is a surface-emitting laser.

6. The circuit device according to claim 1, wherein the first electroconductive film and the second electroconductive film include a binder material.

7. The circuit device according to claim 6, wherein the binder material is composed of one of epoxy, acrylic resin, and polyimide.

8. The circuit device according to claim 6, wherein the binder material is formed from an electroconductive organic polymer.

9. The circuit device according to claim 8, wherein the electroconductive organic polymer is one of poly (p-phenylene), polypyrrole, polythiazyl, polyacetylene, poly (p-phenylene-vinylene), polythiophene, and polyaniline.

10. The circuit device according to claim 1, wherein the first electroconductive film and the second electroconductive film include electroconductive fine particles including a metal.

11. The circuit device according to claim 10, wherein the metal includes at least one of silver, gold, copper, nickel, palladium, tin, and solder.

12. The circuit device according to claim 1, wherein the first electroconductive film and the second electroconductive film include electroconductive fine particles including a carbon.

13. The circuit device according to claim 12, wherein the carbon is at least one of carbon powder, fullerene, and carbon nanotubes.

14. The circuit device according to claim 1, wherein the first conductive type semiconductor is an n-type semiconductor and the second conductive type semiconductor being a p-type semiconductor.

* * * * *